US008917540B2

(12) United States Patent
Cai et al.

(10) Patent No.: US 8,917,540 B2
(45) Date of Patent: Dec. 23, 2014

(54) MEMORY DEVICE WITH SOFT-DECISION DECODING

(71) Applicant: Agency for Science, Technology and Research, Singapore (SG)

(72) Inventors: Kui Cai, Singapore (SG); Zhiliang Qin, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 232 days.

(21) Appl. No.: 13/660,337

(22) Filed: Oct. 25, 2012

(65) Prior Publication Data

US 2013/0107611 A1    May 2, 2013

Related U.S. Application Data

(60) Provisional application No. 61/551,968, filed on Oct. 27, 2011.

(51) Int. Cl.
*G11C 11/00* (2006.01)
*G11C 11/16* (2006.01)

(52) U.S. Cl.
CPC .......... *G11C 11/161* (2013.01); *G11C 11/1673* (2013.01); *G11C 11/1653* (2013.01)
USPC ..................... 365/158; 365/230.06

(58) Field of Classification Search
CPC ............. G11C 11/5642; G11C 13/004; G11C 13/0002
USPC ............................. 365/158, 230.06
See application file for complete search history.

(56) References Cited

U.S. PATENT DOCUMENTS 8,693,257 B2 *    4/2014    Sridharan et al. .......... 365/185.2

OTHER PUBLICATIONS

Chen, et al., Advances and Future Prospects of Spin-Transfer Torque Random Access Memory, 46 IEEE Transactions on Magnetics, 1873 (2010).

* cited by examiner

*Primary Examiner* — Son Dinh
*Assistant Examiner* — Nam Nguyen
(74) *Attorney, Agent, or Firm* — K. David Crockett, Esq.; Niky Economy Syrengelas, Esq.; Crockett & Crockett, PC

(57) ABSTRACT

According to embodiments of the present invention, a memory device with soft decision decoding is provided. The memory device includes a memory cell configured to store an input data bit; a memory sensor configured to read out a parameter associated with a state of the memory cell; a detector configured to determine, based on the parameter read out from the memory cell, a soft information indicating the likelihood that the input data bit stored in the memory cell is a "0" or the likelihood that the input data bit stored in the memory cell is a "1"; and a decoder configured to generate a decoded bit based on the soft information. Further embodiments relate to a method of performing soft-decision decoding on a data bit stored in a memory cell of a memory device.

19 Claims, 9 Drawing Sheets

MEMORY DEVICE WITH SOFT-DECISION DECODING

CROSS-REFERENCE TO RELATED APPLICATION

This application claims the benefit of priority of U.S. provisional patent application No. 61/551,968, filed on Oct. 27, 2011, the contents of which are incorporated herein by reference for all purposes.

TECHNICAL FIELD

Various embodiments relate to memory devices, in particular, memory devices with soft decision decoding.

BACKGROUND

Spin torque transfer magnetic random access memory (STT-MRAM) is a memory technology featuring non-volatility, fast read/write access, high endurance and zero standby power. Each STT-MRAM cell has a magnetic tunneling junction (MTJ) as the storage element and an n-channel metal oxide semiconductor (nMOS) transistor as the access control device. The MTJ includes two ferromagnetic layers, namely, the reference layer and the free layer, separated by a tunneling oxide layer. The magnetization of the reference layer is fixed, while that of the free layer may be changed by passing a driving current polarized by the reference layer. The MTJ resistance is determined by the relative magnetization directions between the reference layer and free layer. That is, the MTJ is in a high resistance state and a low resistance state, respectively, when the magnetization directions are anti-parallel and parallel, respectively. Compared with conventional magnetic random access memory (MRAM), for example, the STT-MRAM has higher scalability with much less write current required. Therefore, STT-MRAM has been considered to be a promising candidate for the next generation non-volatile memories (NVM).

In STT-MRAM, the reliability of data is affected by the process variability induced statistical parametric variations, i.e., variations in the tunneling oxide thickness (t) and cross-section area (A). These variations may affect both the static and dynamic behaviors of the MTJ, resulting in cell failures. Cell failures may be reduced by improving the device design, the material used, and the wafer processing for STT-MRAM. Such improvements may be restricted by physical parameters and conditions.

Another approach is to provide a coding scheme for STT-MRAM. An exemplary (typical) system architecture 100 of a STT-MRAM channel 102 with a slicer 104 (i.e., a threshold detector) and conventional Error Correction Codes (ECCs) such as the Hamming code or Bose-Chaudhuri-Hoquenghem (BCH) code with hard-decision decoding is shown in FIG. 1.

In the system architecture 100, input user data 106 is first encoded by a Hamming/BCH encoder 108 and then transferred to the STT-MRAM channel 102. Hard decoding is subsequently performed by a Hamming/BCH decoder 110 to obtain the recovered data 112.

The conventional threshold detector is a hard output detector. In one example for binary signaling, received pulses are sampled and the resulting voltages are compared with a single threshold. If a voltage is greater than the threshold, it is considered to be definitely a "1" regardless of how close it is to the threshold. If the voltage is less than the threshold, it is considered to be definitely a "0". Hard-decision decoding, or interchangeably referred to as hard decoding, takes a stream of detected bits of "0"s or "1"s output from the threshold detector, and can correct a few errors based on the detected bits of "0"s or "1"s depending on the error correction capability of the code. That is, in decoding performed through hard decisions, bits are treated as either correct or flipped in polarity. The codes used may be conventional ECCs, such as Hamming codes or BCH codes, which are capable of correcting a limited number of errors.

There is therefore a need to provide more efficient coding and detection schemes to correct more STT-MRAM cell failures due to, for example, process variability induced parametric variations such as variations in tunneling oxide thickness and variations in tunneling oxide cross-section, the switching current threshold distribution which causes write failure and/or read failure of the cell, and parasitic effects such as parasitic capacitance of the cell.

SUMMARY

According to an embodiment, a memory device is provided. The memory device may include a memory cell configured to store an input data bit; a memory sensor configured to read out a parameter associated with a state of the memory cell; a detector configured to determine, based on the parameter read out from the memory cell, a soft information indicating the likelihood that the input data bit stored in the memory cell is a "0" or the likelihood that the input data bit stored in the memory cell is a "1"; and a decoder configured to generate a decoded bit based on the soft information.

According to an embodiment, a method of performing soft-decision decoding on a data bit stored in a memory cell of a memory device is provided. The method may include reading out a parameter associated with a state of a memory cell; determining based on the parameter read out from the memory cell a soft information indicating the likelihood that a data bit stored in the memory cell is a "0" or the likelihood that the data bit stored in the memory cell is a "1"; and generating a decoded bit based on the soft information.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1:
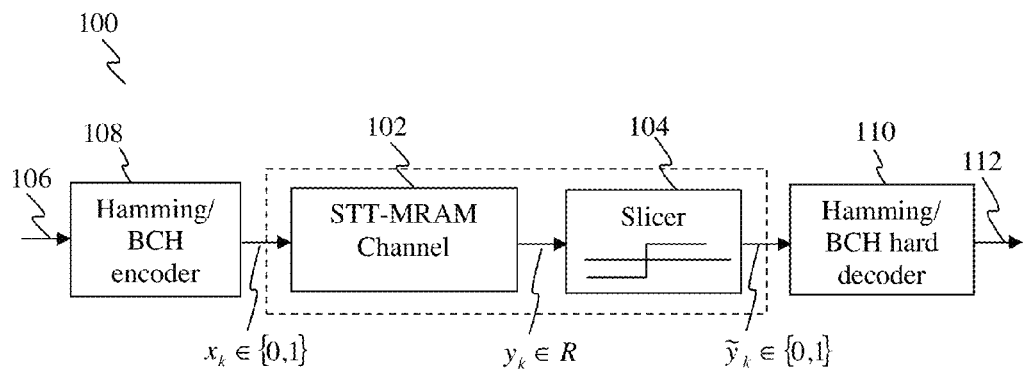
FIG. 1 shows a schematic block diagram of an exemplary system architecture of a STT-MRAM channel with ECCs with hard-decision decoding.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

In the context of various embodiments, the term "about" as applied to a numeric value encompasses the exact value and a variance of +/−5% of the value.

Various embodiments may provide coding and signal processing for non-volatile memories (NVM), and in particular for spin transfer torque magnetoresistive random access memory (STT-MRAM). Various embodiments may further provide information theory based design of LDPC-coded channel for STT-MRAM.

A first ever coding, for example, LDPC coding, with soft-decision decoding scheme for a memory device, for example, STT-MRAM, may be provided in accordance with various embodiments. The scheme involves a parameter indicative of an input data bit stored in the STT-MRAM to be obtained. For example, this parameter may be but is not limited to a resistance value measured from the memory cell. Based on this parameter, the scheme is able to determine the stored data bit (i.e., a bit of "0" or a bit of "1").

In various embodiments, a resistance distribution based generic channel model may be applied to describe the key features and cell failure mechanisms of STT-MRAM. A quantizer may be used to transform an analogue read back signal (for example, the memory cell resistance value) from the channel into quantized data, and a soft-output channel detector may generate soft information of the quantized channel output. The capacity of the STT-MRAM channel, which provides the theoretical maximum of the number of information bits that can be stored in a STT-MRAM cell, may be determined or computed. In one embodiment, the capacity maximization criterion may be used to design the quantizer and minimize the number of quantization bits for the LDPC-coded channel for STT-MRAM, without resorting to tedious and time-consuming computer simulations for conventional design of a quantizer. The quantizer, in accordance with various embodiments, may be optimally designed in the sense that it maximizes the number of information bits that may be stored in the memory cell. In another embodiment, the capacity maximization criterion may be used to design the quantizer at low error rate regions.

The soft-decision decoding scheme as described herein may be applied to STT-MRAM with arbitrary resistance distributions. Various modifications will be apparent to those skilled in the art. For example, the resistance distributions may be but is not limited to be based on the Gaussian distribution. In other examples, instead of LDPC codes, the system architecture with the quantizer may be used by other ECC coding schemes (e.g. RS codes, BCH codes, or turbo codes) with soft-decision decoding for STT-MRAM.

Figure 2:
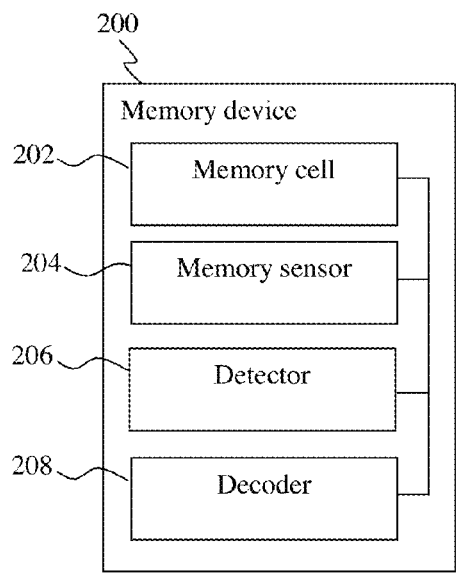
FIG. 2 shows a schematic block diagram of a memory device with soft-decision decoding, according to various embodiments.

FIG. 2 shows a schematic block diagram of a memory device with soft-decision decoding, according to various embodiments. In FIG. 2, the memory device 200 may include a memory cell 202 configured to store an input data bit; a memory sensor 204 configured to read out a parameter associated with a state of the memory cell; a detector 206 configured to determine, based on the parameter read out from the memory cell 202, a soft information indicating the likelihood that the input data bit stored in the memory cell 202 is a "0" or the likelihood that the input data bit stored in the memory cell 202 is a "1"; and a decoder 208 configured to generate a decoded bit based on the soft information.

In the context of various embodiments, the term "memory device" may be interchangably referred to as "memory" or "memory cell arrangement".

In various embodiments, the memory device 200 may include a non-volatile memory device. For example, the memory device 200 may also be but are not limited to resistive random-access memory (RRAM) (such as, for example, a phase change memory random-access memory (PCRAM) or conductive bridging random-access memory (CBRAM)) or magnetoresistive random-access memory (MRAM) or redox-based resistive switching memory.

In one embodiment, the memory device 200 may be a spin transfer torque magnetoresistive random access memory (STT-MRAM) device. The memory cell 202 may include a magnetoresistive memory cell, which is a kind of resistive memory cell, that can be switched between two or more states exhibiting different electrical resistance values.

Figure 3A:
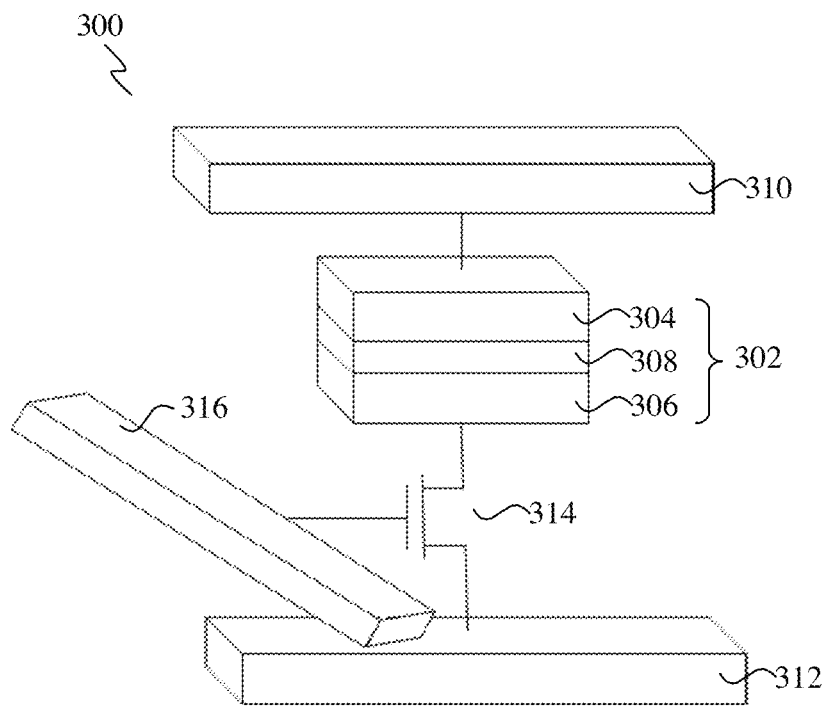
FIG. 3A shows a schematic drawing of the STT-MRAM cell, according to various embodiments.
Figure 3B:
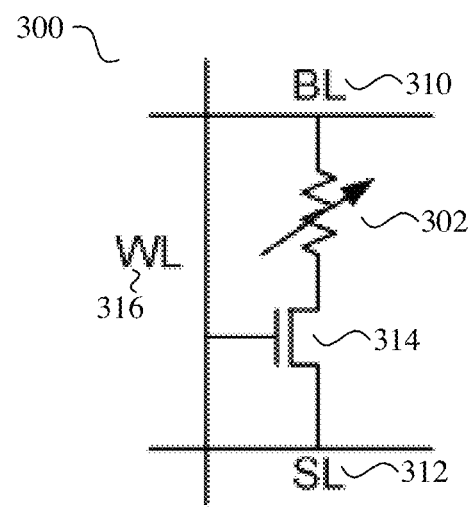
FIG. 3B shows a symbolic representation of the STT-MRAM of FIG. 3A, according to various embodiments.

STT-MRAM may be considered as a promising candidate for the next generation of non-volatile memory as it possesses the advantages of scalability, high endurance, high speed and low energy consumption. FIG. 3A shows a schematic diagram of a STT-MRAM cell 300, for example, the memory cell 202 of FIG. 2. The STT-MRAM cell 300 may include a magnetic tunneling junction (MTJ) 302 which is made of a ferromagnetic free layer (FL) 304 and a ferromagnetic reference layer (RL) 306, sandwiching a thin barrier spacer 308. The FL 304 of the MJT 302 may be coupled to a bit line (BL) 310 and the RL 306 of the MJT 302 may be coupled to a source line (SL) 312 via a switching transistor 314 controlled by a word line (WL) 316. Symbolically, the STT-MRAM cell 300 may be represented as shown in FIG. 3B.

The STT-MRAM cell 300 may operate in two kinds of schemes, namely, (i) in-plane and (ii) perpendicular. The differences lie on the directions of the magnetization direction of the FL 304 and RL 306. For the in-plane STT-MRAM, the magnetizations of the FL 304 and RL 306 are lying along the in-plane direction. For the perpendicular STT-MRAM, the magnetizations of the FL 304 and RL 306 are lying along the out-of-plane direction. When the magnetizations of the FL 304 and RL 306 are in parallel (P) (or in-plane) directions, the magnetoresistance is of a low resistance state due to tunneling magnetoresistance effect. The magnetoresistance is of a high resistance state when both the FL 304 and RL 306 are in an anti-parallel (AP) configuration (or out-of-plane directions). The switching of the magnetization direction of the FL 304 may occur by spin transfer torque effect, having an electrical current flowing through the MTJ device. For example, the direction of the magnetization switching may be controlled by the direction of the electrical current flow.

In the context of various embodiments, the "memory sensor" 204 may be a circuit that measures a parameter associated with a state of the memory cell 202 (e.g. the low resistance state or the high resistance state). For example, this parameter may be in an analogue form in terms of voltage, current, or resistance.

The term "read out" may relate to "perform a read operation" which is an operation where the parameter associated with the state of the memory cell 202 storing a data bit (i.e. "1" or "0") is "measured", "obtained", or "determined".

In the context of various embodiments, the term "store" generally refers to a data bit that has been written into the memory cell 202 via a "write operation" and retained therein. In the context of the STT-MRAM cell 300, the term "store" relates to magnetizations of the FL 304 and RL 306 lying along the in-plane direction (for a low resistance state or a bit "0") or lying along the out-of-plane direction (for a high resistance state or a bit "1").

As used herein, the "soft information" may be represented in various ways. Soft information may relate to probability or may be represented by log likelihood ratio (LLR).

For comparison and illustrative purposes only, the "input data bit" may, for example, be similar to one bit of the input user data 106 of FIG. 1 and the "output data bit" may, for example, be similar to one bit of the recovered data 112 of FIG. 1.

Figure 5:
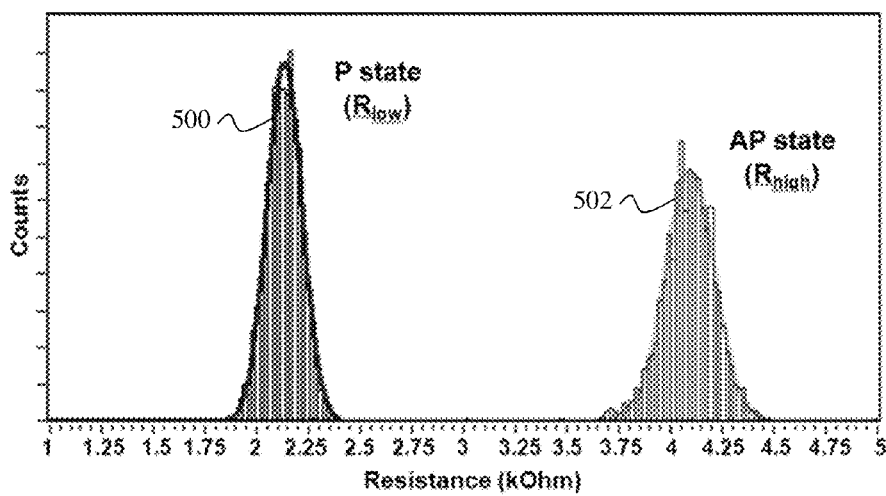
FIG. 5 shows resistance distributions of low and high resistance states across an STT-MRAM chip sub-array, according to various embodiments.
Figure 7:
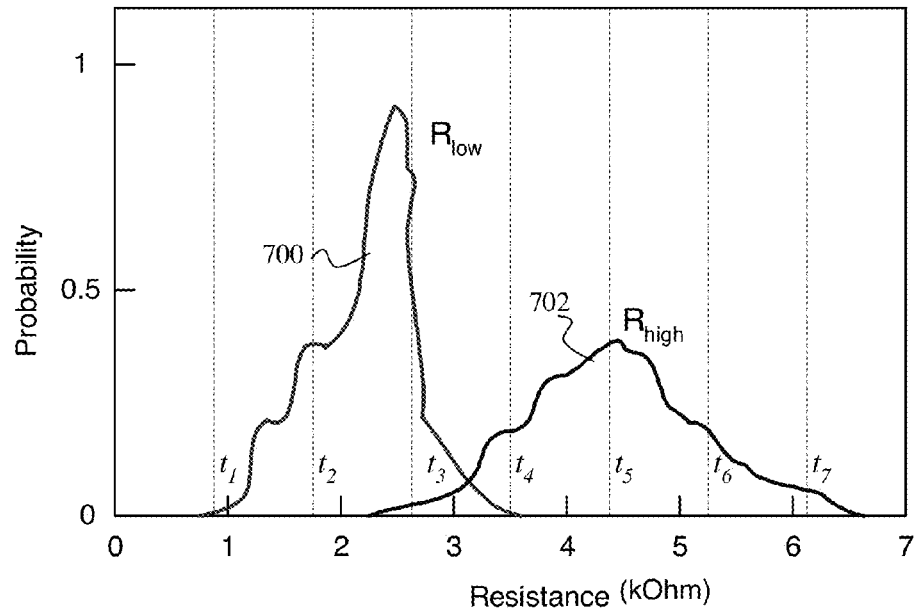
FIG. 7 shows assumed probability distributions of low and high resistance states across an STT-MRAM channel with a 3-bit uniform quantizer, according to various embodiments.

In various embodiments, the state may include a high resistance state or a low resistance state. For the high resistance state, the memory cell may have a resistance of any value following a resistance distribution of the high resistance state; and for the low resistance state, the memory cell may have a resistance of any value following another resistance distribution of the low resistance state. For example, the resistance value of each state may follow a distribution (as illustrated in FIG. 5 and FIG. 7) due to process variations. Thus, for a given resistance state, the resistance of the memory cell 202 may take any value following the corresponding resistance distribution.

In some embodiments, each of the resistance distributions may be a statistical distribution of resistance values. For example, the statistical distribution may be but is not limited to Gaussion distribution and Weibull distribution.

In one embodiment, each of the resistance distributions may be a Gaussian distribution of resistance values.

In various embodiments, at the high resistance state, the memory cell 202 may have a resistance value with mean of $\mu_H$=4.125 kOhm, and standard derivation of $\sigma_B$=0.1238 kOhm. At the low resistant state, the memory cell 202 may have a resistance value with mean of $\mu$=2.0625 kOhm and standard derivation of $\sigma$=0.0825 kOhm.

In various embodiments, the memory device 200 may further include a quantizer configured to convert the resistance value of the memory cell 202 into a quantized data. For example, in quantization, the quantizer may perform the procedure of constraining the resistance value from a relatively large or continuous set of values (such as the real numbers) to a relatively small discrete set (such as the integers).

The quantizer may include a n-bit quantizer with a total of $2^n$ quantization levels to represent all the possible resistance values for a memory cell with a given state. For example, n may be but is not limited to 1, 2, 3, or 4. When n=1, the quantizer is a slicer, which may be similar to the slicer 104 of FIG. 1.

In the context of various embodiments, the "detector" 206 may be referred to as a soft-output detector. The detector 206 may be configured to determine the soft information based on the output from the quantizer.

In various embodiments, the memory device 200 may include an array of memory cells configured to store input data bits. Any memory cell in the array may be the memory cell 202 of FIG. 2.

In various embodiments, the memory device 200 may further include an encoder configured to encode the input data bits to be stored in the array of memory cells. For example, the encoder may be an ECC encoder configured to encode the input data bits into coded bits to be stored in the array of memory cells. For example, the encoder and its corresponding decoder, e.g., the decoder 208, may be but are not limited to a Hamming encoder and a Hamming decoder; or a BCH encoder, or a BCH decoder.

In various embodiments, the encoder may include a low-density parity-check (LDPC) encoder and the decoder may include a low-density parity-check (LDPC) decoder.

The LDPC encoder and decoder use LDPC code. The LDPC code is a type of ECCs that has the capability to approach the Shannon Capacity. It has been applied in practical communications and magnetic/optical storage systems, and hence has shown high potential for STT-MRAM. LDPC codes with soft-decision decoding may provide improved error rate performance than conventional ECCs with hard decoding. However, the application of LDPC codes in STT-MRAM is more complex than that of conventional ECCs, as soft information of the channel output other than hard decisions are needed. These soft information is generated by the soft-output channel detector, which needs to be designed to match up with the associated channel model.

In the practical applications of LDPC codes, a quantizer needs to transform an analogue read back (or read out) signal (e.g. memory cell resistance value) into quantized data. As described herein, the quantization also facilitates the calculation of soft information for LDPC decoding for STT-MRAM channels with arbitrary resistance distributions. Therefore, the design of the quantizer and the determination of the minimum number of quantization bits are critical, for the application of LDPC codes in STT-MRAM, as these directly affect the error rate performance, the speed, and the silicon area of the memory device 200. In contrast, the conventional design of a quantizer based on computer simulations is tedious, and time consuming. Furthermore, the performance at low error rate regions cannot be simulated; and the minimum mean-square error (MMSE) based quantization may also not be optimum as the conventional design of a quantizer based on computer simulations minimizes the MSE only.

In one example, the memory device may include the memory cell configured to store the input data bit; the memory sensor configured to read out the resistance value of the memory cell; the detector configured to determine based on the resistance value of the memory cell, and generate the information which indicates the likelihood that the input data bit stored in the memory cell to be "0" or the likelihood that the input data bit stored in the memory cell to be "1" ((i.e. log-likelihood ratios (LLR), or soft information) based on the memory cell resistance valued provided by the memory sensor; and the decoder configured to generate a decoded bit based on the soft information provided by the detector.

Figure 4:
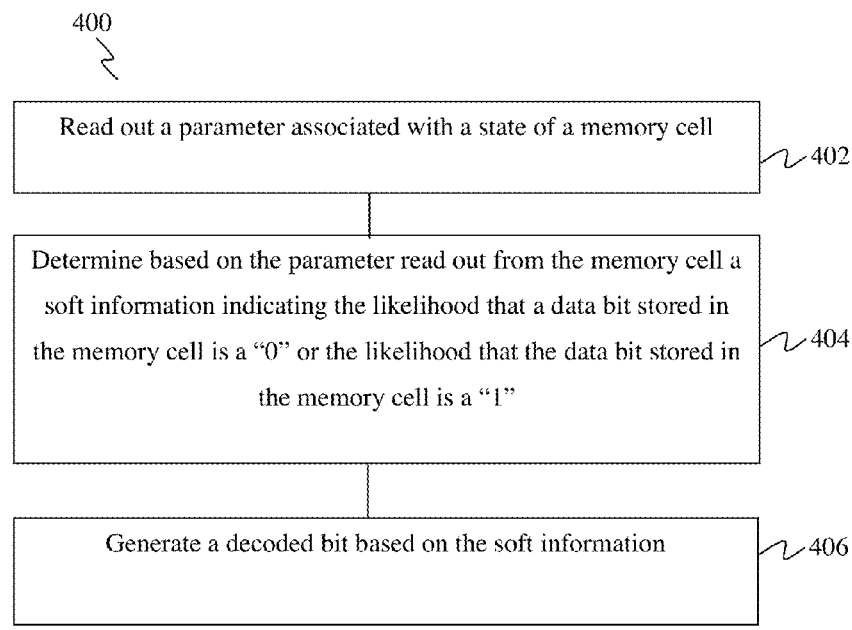
FIG. 4 shows a flow chart illustrating a method of performing soft-decision decoding on a data bit stored in a memory cell of a memory device, according to various embodiments.

Various embodiments may provide a method of performing soft-decision decoding on a data bit stored in a memory cell of a memory device 400, as shown in FIG. 4. In FIG. 4, at 402, a parameter associated with a state of a memory cell may be read out. At 404, a soft information indicating the likelihood that a data bit stored in the memory cell is a "0" or the likelihood that the data bit stored in the memory cell is a "1" may be determined based on the parameter read out from the memory cell. At 406, a decoded bit may be generated based on the soft information.

The terms "soft-decision decoding", "read out", "stored", "state" "soft information" may be as defined hereinabove.

The memory device may be the memory device 200 of FIG. 2 and the memory cell may the memory cell 202 of FIG. 2.

In various embodiments, the method 400 may further include converting a resistance value of the memory cell into a quantized data. Converting the resistance value into the quantized data may further include converting the resistance value into a quantized n-bit data.

The term "resistance value", "quantized data", and "n" may be as defined above.

In various embodiments, determining the soft information 404 may include determining the soft information based on a log-likelihood ratio (LLR) for the quantized data.

In various embodiments, the method 400 may include encoding input data bits to be stored in an array of memory cells.

The encoding and decoding may use low-density parity-check (LDPC) code.

In an example, the method may include reading out the resistance value of the memory cell; generating the soft information based on the resistance value of the memory cell; and providing the decoded bits based on the soft information.

Some examples may provide a method of determining a distribution of resistance values for a memory state for soft-decision decoding of data bits stored therein. A plurality of resistance values for a plurality of memory cells of the memory device may be measured; a distribution of resistance values for a memory state may be statistically determined from the plurality of resistance values.

The term "resistance state", "soft-decision decoding", "stored", "resistance value", "distribution of resistance values", and "statistically determined" may be as defined above.

The memory device may be the memory device 200 of FIG. 2 and the memory cell may the memory cell 202 of FIG. 2.

The term "measured" may refer "read out", "obtained", or "determined" as defined hereinabove.

The distribution of resistance values may be but is not limited to be determined using Gaussian approximation.

Various embodiments of the LDPC-coded channel for STT-MRAM will be described in further details and with respect to specific examples, as follow:— the system architecture of LDPC-coded channel for STT-MRAM, where the quantizer and the soft-output channel detector are used to enable the calculation of soft information for arbitrary resistance distributions, the soft-output channel detector (LLR generator) with quantized channel output which may generate soft information of the quantized channel output, the capacity-based design of quantization scheme that maximizes the number of information bits that can be stored in a memory cell, and minimizes the number of quantization bits, without resorting to tedious and time consuming computer simulations; thereby being especially useful for designing quantizer for low error rate regions.

Channel Model

Among many factors affecting the performance and cell failures of STT-MRAM devices, the parametric variations caused by process variations are a key issue. In the static state of MTJ, for example, the MJT 302 of the STT-MRAM cell 300 of FIG. 3, due to the quantum mechanical tunneling, the high and low resistance values vary exponentially with t, and are inversely proportional to A. For the dynamic behavior of MTJ, variations in A introduce a linear shift in switching threshold current, resulting in a widened switching threshold current distribution which may cause both write failures and read failures. In addition, the increase of operating frequency may also widen the switching threshold current distribution.

In various embodiments, a resistance distribution based channel model may be applied to describe the distributions of the low and high resistances of STT-MRAM and their broadening, which is caused by various factors including the parametric variations induced variations of the static state resistances, the write and read failures caused by the switching threshold current distribution, as well as the resistance variations due to the parasitic effects. These resistance distributions may be obtained statistically, by measuring the resistances of a large amount of memory cells in the STT-MRAM array.

As an example, the distributions of the static resistances of a 256 Kb STT-MRAM testing chip integrated with a 90 nm CMOS are shown in FIG. 5. It is observed from FIG. 5 that the resistance distributions of the MTJ resistances (i.e., the low resistance state, $R_{low}$ 500 where the magnetizations of the FL and RL of the MJT are in parallel (P state); and the high resistance state, $R_{high}$ 502 where the magnetizations of the FL and RL of the MJT are in anti-parallel (AP state)) approximately follow Gaussian distributions. The mean values are $\mu=2.0625$ kOhm and $\mu_H=4.125$ kOhm, respectively, and the standard derivations are $\sigma=0.0825$ kOhm and $\sigma_H=0.1238$ kOhm, respectively. Thus, $\sigma_H=0.156$. Based on these static resistance distributions, the resistance distributions are widened by enlarging $\sigma$ and $\sigma_H$ to account for the large spread of variations of the MTJ resistances due to the write and read failures caused by the switching threshold current distribution, as well as the resistance variations due to the parasitic effects.

The above Gaussian approximation is only for the sake of faster simulations. The various designs may be applied to STT-MRAM with arbitrary resistance distributions, and the Gaussian assumption of the resistance distributions may not be necessary.

System Architecture

Figure 6:
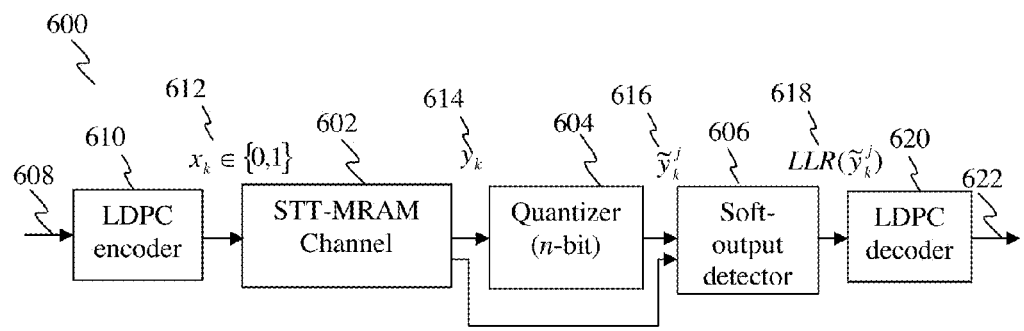
FIG. 6 shows a schematic block diagram of the system architecture of a LDPC-coded channel with a quantizer and a soft-output channel detector for STT-MRAM, according to various embodiments.

A block diagram of the LDPC-coded channel 602 with a quantizer 604 and a soft-output channel detector 606 for STT-MRAM is shown in FIG. 6. The STT-MRAM may refer to the memory device 200, and the soft-output channel detector may refer to the detector 206 of FIG. 2. The input user data 608 is first encoded using an LDPC encoder 610, which introduces redundant bits into the user data for correcting the errors that may occur in the STT-MRAM device 600 and system. The encoded data 612 is then written into the STT-MRAM memory 600. As described above, during writing, reading and storage of information in the STT-MRAM memory cells, errors may occur. The corresponding channel model is as described above. In the readback (or read out) process, the data 614 is read from the memory and a quantizer 604 is used to map the analogue values of the resistances into quantized values 616. The soft-output channel detector 606 receives the quantized data 616 from the quantizer 604, and calculates the log-likelihood ratios (LLRs, the logarithm of the ratio of the a posteriori probability (APP) of a bit being a "0" to the APP of it being a "1") for each quantized data bit base on the given STT-MRAM channel model 602. Therefore, it may essentially be regarded as a LLR generator. These LLRs 618 are soft information which enables the use of LDPC codes with soft decoding. Thus, the LLRs 618 output by the soft-output channel detector 606 are used by the LDPC decoder 620 to recover the original data what was written into the memory (i.e., the recovered data 622).

It should be appreciated that other than LDPC codes, the channel architecture 600 with the quantizer 604 may be used by other ECC coding schemes (e.g. RS or BCH or Hamming codes) with soft decoding for STT-MRAM as well.

Soft-Output Channel Detector (i.e. LLR Generator) with Quantized Channel Output

An STT-MRAM channel with probability density functions (pdfs) of the resistances given by $p(y_k|x_k=i)$, with i=0, 1 is considered. Here, $x_k$ and $y_k$ are the $k^{th}$ input user data and the corresponding unquantized readback resistance value, respectively. In various embodiments, without loss of generality, the low resistance state is associated with or corresponds to $x_k=0$ and the high resistance state with $x_k=1$. It should be understood and appreciated that the above conditional pdf for $y_k$ is not necessarily to be Gaussian distributed. A n-bit quantizer with $L=2^n$ quantization levels, which maps the unquantized readback resistance value $y_k$ into corresponding quantized values $\tilde{y}_k$ is considered. Let $\{t_0, t_1, \ldots, t_L\}$ with $t_0=-\infty$ and $t_L=+\infty$ be the boundaries of the quantization intervals, $N_j=(t_j, t_{j+1})$, with j=0, 1, ..., L−1, be the $j^{th}$ quantization interval, and $\tilde{y}_k^0, \tilde{y}_k^1, \ldots, \tilde{y}_k^{L-1}$ be the possible quantized values within each of the L quantization intervals. An illustration of an STT-MRAM channel with a 3-bit uniform quantizer is shown in FIG. 7. As seen in FIG. 7, the low resistance state ($R_{low}$) 700 and the high resistance state ($R_{high}$) 702 are denoted by respective distributions of resistance values.

The transition probability $P_{ij}$, which indicates the probability that the received resistance value $y_k$ falling into the $j^{th}$ quantization interval of $N_j$, is given by $$P_{ij} = Pr(y_k \in N_j | x_k = i) \quad (1)$$
$$= Pr(\tilde{y}_k^j | x_k = i)$$
$$= \int_{N_j} p(y_k | x_k = i) dy_k.$$

It should be understood that for Gaussian distributed pdf $p(y_k|x_k=i)$, the probabilities $P_{ij}$ given by Eqn (1) may be computed analytically. For $p(y_k|x_k=i)$ with arbitrary distributions, the value of $P_{ij}$ may be calculated numerically.

Therefore, the corresponding LLRs may be expressed as $$L(x_k) = \log\left(\frac{Pr(x_k = 0 | \tilde{y}_k^j)}{Pr(x_k = 1 | \tilde{y}_k^j)}\right) \quad (2)$$
$$= L_{ch}(\tilde{y}_k^j) + \log\frac{Pr(x_k = 0)}{Pr(x_k = 1)},$$

where log is the natural logarithm.

The channel LLR, $L_{ch}(\tilde{y}_k^j)$, is given by $$L_{ch}(\tilde{y}_k^j) = \log\left(\frac{Pr(\tilde{y}_k^j | x_k = 0)}{Pr(\tilde{y}_k^j | x_k = 1)}\right) \quad (3)$$
$$= \log\left(\frac{P_{0j}}{P_{1j}}\right).$$

It should be understood and appreciated that other than LDPC codes, the above described soft-output detector with quantized channel output may be used by other ECC coding schemes (e.g. RS or BCH or Hamming codes) with soft decoding for STT-MRAM as well.

Capacity-Based Design of Quantization Scheme

In the practical applications of LDPC codes, the LDPC decoder operates on finite precision quantized data. Therefore, a quantizer is needed before the LDPC decoder. Furthermore, as mentioned above, the pdfs $p(y_k|x_k=i)$ of the MTJ resistances are not necessarily to be Gaussian distributed. Therefore, it would be difficult to derive closed form expressions to calculate the channel LLRs. In various embodiments, a quantizer is used to quantize the analogue readback (or read out) resistance values. As described above, the quantization facilitates the calculation of LLRs for STT-MRAM channels with arbitrary resistances distributions.

The design of the quantizer and the determination of the minimum number of quantization bits are important for the application of LDPC codes in STT-MRAM, as these aspects directly affect the error rate performance, the speed, and the silicon area of the memory chip. The quantizer design based on computer simulations is tedious and time consuming, and is unable to simulate low error rate regions. The MMSE based quantization is also not optimum as it minimizes the MSE only. According to Eqns. (1) to (3), for a quantized STT-MRAM channel with given resistance distributions $p(y_k|x_k=i)$, the channel LLRs are solely determined by the probabilities $P_{ij}$. Therefore, the number of quantization bits n and the boundaries of the quantization intervals are the parameters to be selected. A fundamental quantity that is modified by this selection process is the capacity of the quantized channel. Therefore, the quantizer by maximizing the capacity of the quantized STT-MRAM channels is designed. The designed quantizer is hence optimum in the sense that it maximizes the number of information bits that may be stored in a memory cell.

Calculation of the Capacity

Figure 8:
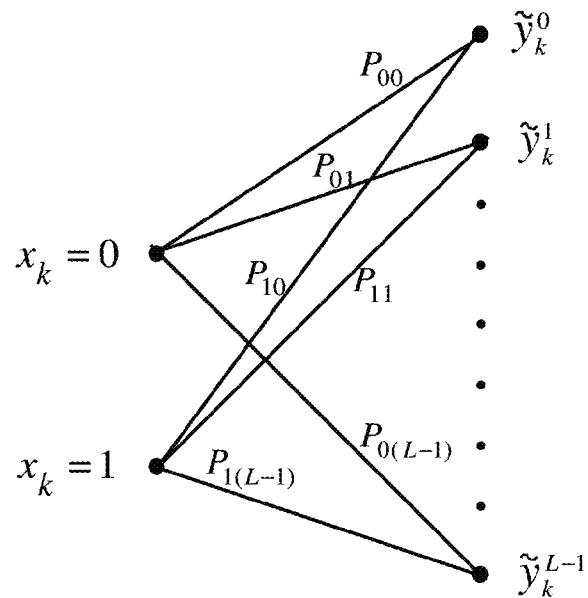
FIG. 8 shows a schematic diagram of an equivalent channel of an STT-MRAM channel with quantized output, according to various embodiments.

The quantizer converts the analog channel into a discrete channel described by a set of transition probabilities $P_{ij}$. The transition probabilities are functions of the resistance pdf $p(y_k|x_k=i)$ and the quantizer. A block diagram of the equivalent channel of an STT-MRAM channel with quantized output is given by FIG. 8. In FIG. 8, quantization of the output of the STT-MRAM channel with n bits produces an equivalent channel with two inputs and $L=2^n$ outputs.

The mutual information rate of the equivalent channel of FIG. 8 may be defined as $$I(X;Y) = H(Y) - H(Y|X) \quad (4)$$

where H(Y) is the entropy of the channel output, given by $$H(Y) = -\sum_{j=0}^{L-1} Pr(y_k \in N_j) \log_2(Pr(y_k \in N_j)), \quad (5)$$

With $$Pr(y_k \in N_j) = \sum_{i=0}^{1} Pr(y_k \in N_j \mid x_k = i) Pr(x_k = i)$$

$$= \sum_{i=0}^{1} P_{ij} Pr(x_k = i).$$

Here, H(Y|X) is the conditional entropy of channel output given channel input, given by $$H(Y \mid X) = -\sum_{i=0}^{1} \sum_{j=0}^{L-1} Pr(x_k = i) Pr(y_k \in N_j \mid x_k = i) \quad (6)$$

$$\log_2(Pr(y_k \in N_j \mid x_k = i))$$

$$= -\sum_{i=0}^{1} \sum_{j=0}^{L-1} Pr(x_k = i) P_{ij} \log_2(P_{ij}).$$

The capacity is given by $$C = \max_{\{Pr(x_k=0)\}} I(X; Y). \quad (7)$$

Figure 9:
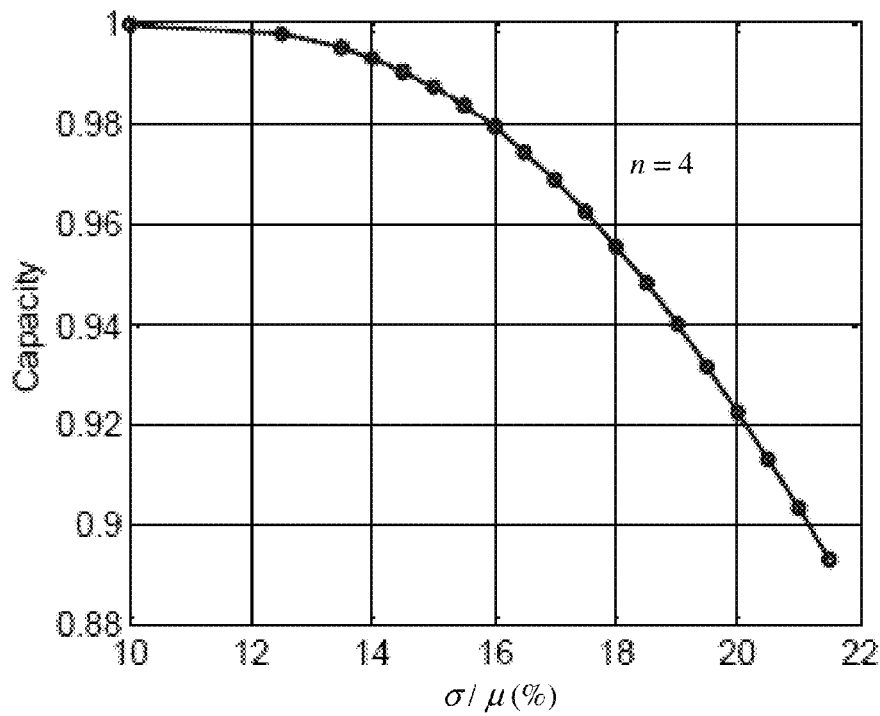
FIG. 9 shows the relationship between the capacity and the relative resistance spread (i.e., σ/μ (%)) for a LDPC-coded STT-MRAM channel, according to various embodiments.

As an example, FIG. 9 shows the relationship between the capacity and the percentage ratio of σ and μ (i.e., σ/μ(%)) for n=4.

Quantizer Design Based on Capacity Maximization

The number of quantization bits n and the boundaries of the quantization intervals is determined by maximizing the capacity C of the quantized channels. As shown by FIG. 7, with $t_0=-\infty$ and $t_L=+\infty$, a uniform quantizer divides the quantization range $[t_1, t_{L-1}]$ uniformly into $L=(2^n-2)$ intervals. This gives a resolution (spacing between quantization values) of $\delta=(t_{L-1}-t_1)/(2^n-1)$. Without loss of generality, $t_1$ and $t_{L-1}$ are set as follow $t_1=\mu+\alpha\sigma$ and $t_{L-1}=\mu_H-\beta\sigma_H$. The values of n, α and β are varied to study the respective impacts on the capacity and the bit error rate (BER)/block error rate (BLER). It is noted that the uniform quantizer which is easy for practical implementation is used here. The non-uniform quantizer has been explored by applying a local search in the region around the capacity maximizing uniform quantizers. It has been found that the loss of uniform quantization compared to nonuniform is negligible.

Figure 10A:
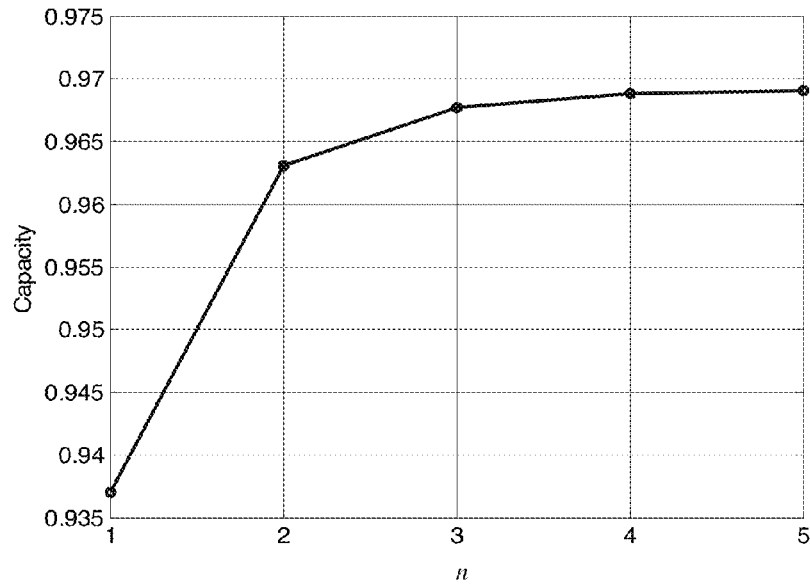
FIG. 10A shows the relationship between the capacity and the number of the quantization bits n for a LDPC-coded STT-MRAM channel, with σ/μ=17%, according to various embodiments.
Figure 10B:
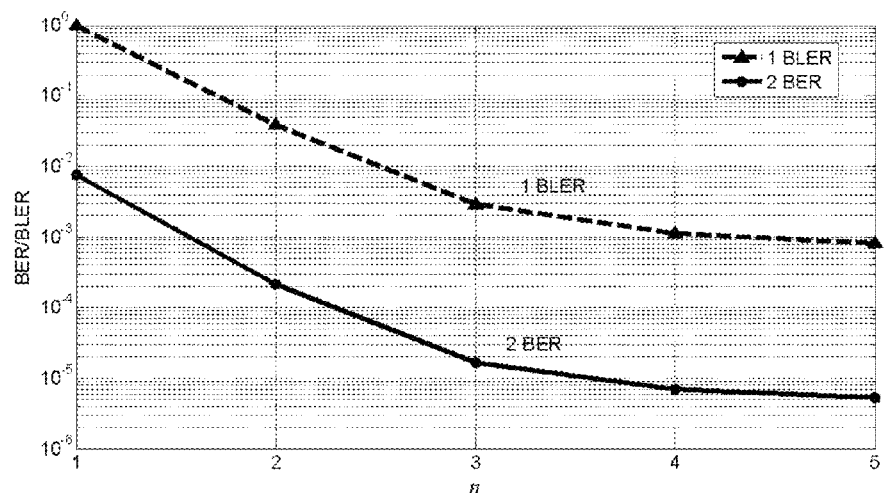
FIG. 10B shows the relationship between the BER/BLER performance and n for a LDPC-coded STT-MRAM channel, with σ/μ=17%, according to various embodiments.

In FIGS. 10A and 10B, the computed capacity and simulated BER/BLER, respectively, are shown as a function of n. In computing the capacity, for each n, and the corresponding α and β which decide the quantization boundaries are selected by using the capacity maximization criterion. Without loss of generality, σ/μ=17% is chosen in the simulations. It should be understood that σ/μ=17% is an example and other values of σ/μ may also be used. As can be seen, the tendency of capacity (FIG. 10A) coincides with that of the BER/BLER (FIG. 10B). FIG. 10A and FIG. 10B clearly show that a capacity-maximizing quantizer with 3 to 4 quantization bits is sufficient to obtain near optimum error rate performance. A 3 or 4-bit quantization may be implemented in the memory chip without introducing significant area and latency penalty, for example by using a successive approximation register (SAR) or flash analog-to-digital converter (ADC). For an n bit quantization, the SAR ADC consists of one sensing amplifier with n successive reads, while the flash ADC requires $2^n-1$ parallel sensing amplifiers with one read only.

Figure 11:
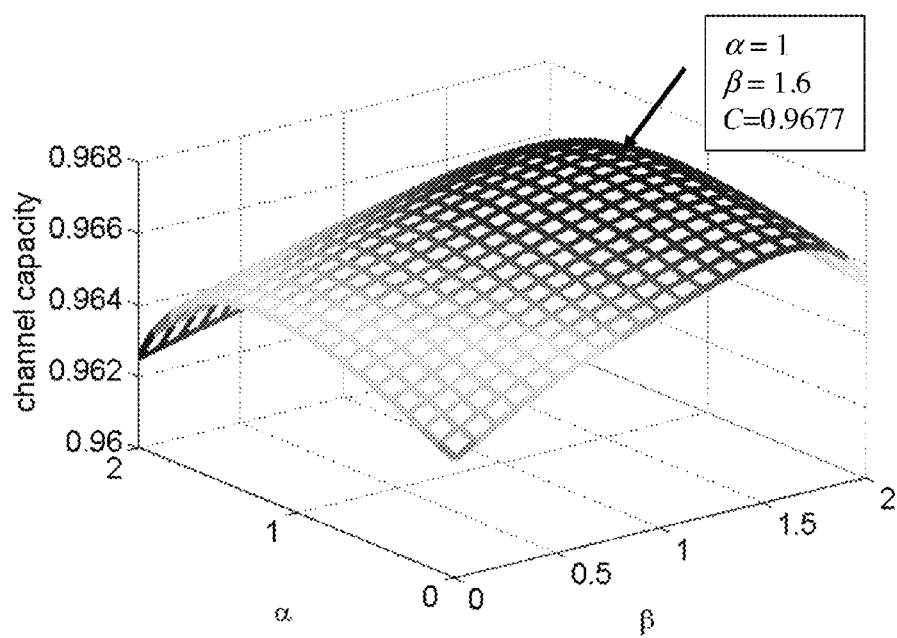
FIG. 11 shows the relationship of capacity as a function of α and β for a LDPC-coded STT-MRAM channel, with σ/μ=17% and n=3, according to various embodiments.

The computed two-dimensional capacity is further described as a function of α and β, with σ/μ=17% and n=3 as seen in FIG. 11. In FIG. 11, the maximum capacity $C^{max}=$(X; Y)=0.9677 is obtained with a choice of α=1 and β=1.6. Note that the obtained values of α and β are positive, which coincides with initial intuition that more errors may occur near the overlapping region of the two resistance states, and hence quantization should be concentrated around this region. Computer simulations were further carried out to evaluate the performance of the LDPC-coded STT-MRAM channel with a 3-bit quantizer, and over different choices of α and β. It was observed that α and β around the values obtained using the capacity maximization criterion indeed lead to the best BER and BLER. Similar observations have also been obtained with other values of σ/μ and n as well. The above results demonstrate the effectiveness of using the proposed capacity maximization criterion in the quantizer design.

Simulation Results

Simulation was carried out for the LDPC-coded STT-MRAM channel with the quantizer in accordance to various embodiments. The corresponding channel architectures are shown in FIG. 6. The performances of the systems with a conventional threshold detector and the BCH encoder/decoder as shown in FIG. 1 are also included for reference purpose. In various embodiments, the LDPC code used is a rate 0.9358 (4095, 4376) random LDPC code with column weight of 4. The BCH code is a rate 0.9375 (4096, 4369) code which can correct t=21 bit errors per codeword. It is designed to have a similar code rate and code word length with the LDPC code. The quantizer is designed by using the capacity maximization criterion as described above, with different number of quantization bits n. For comparison, The performance with the quantizer designed using the MMSE criterion is also simulated. In particular, the Lloyd-Max algorithm is adopted to optimize the quantization boundaries and levels for the given STT-MRAM channels. This gives the optimum quantizer in the sense of the MSE. The decoder of the LDPC codes is based on the sum-product algorithm (SPA), and its inputs are the quantized resistances. The corresponding BER/BLER performances are shown in FIG. 12.

Figure 12:
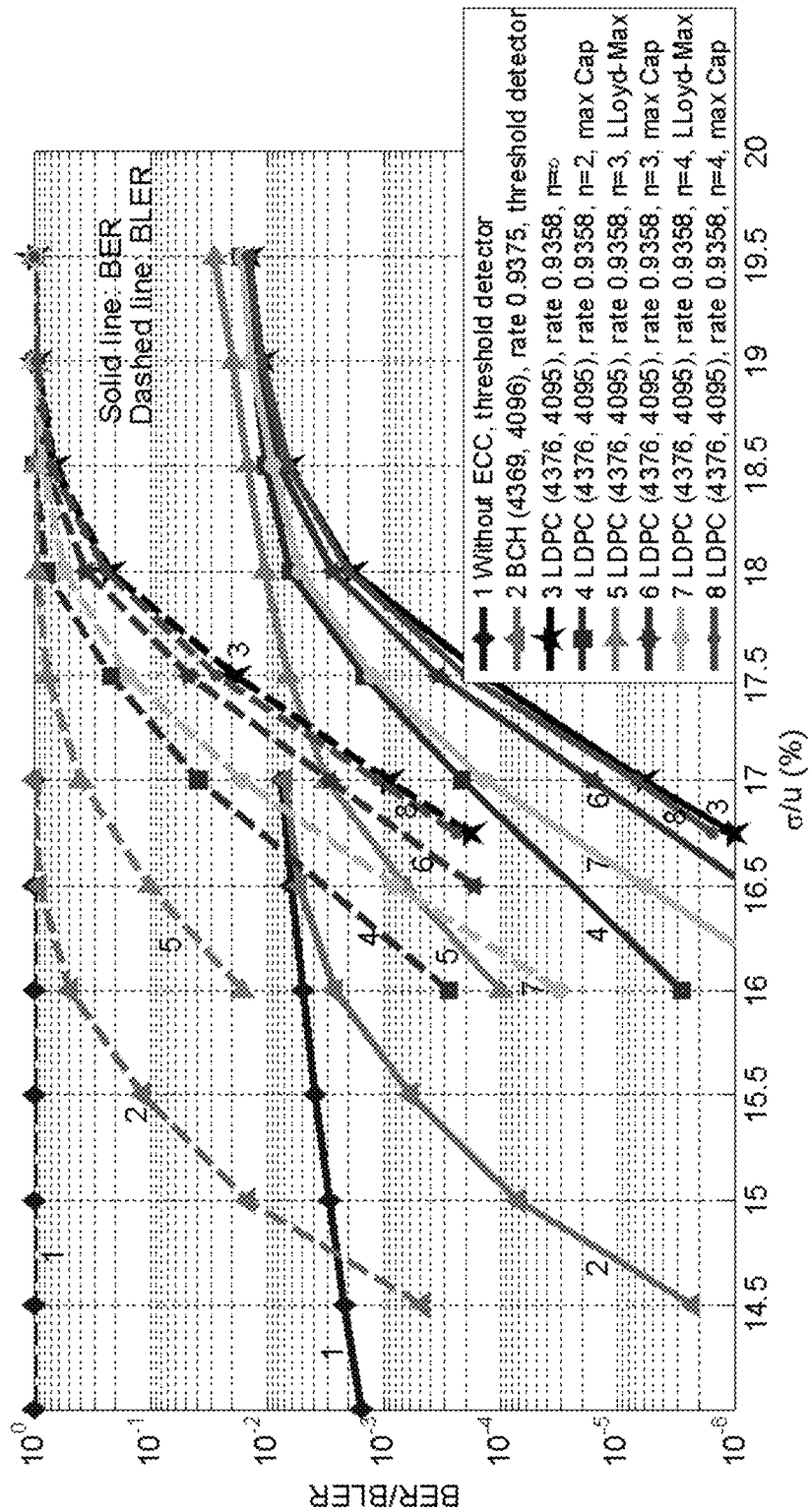
FIG. 12 shows the BER/BLER performance of STT-MRAM channels without ECC, with BCH codes, and with LDPC codes, according to various embodiments.

From FIG. 12, it is observed that the LDPC-coded STT-MRAM channels with the quantizer and the soft-output channel detector, in accordance with various embodiments, provide significant performance gain over the system with conventional threshold detector and the BCH-ECC, in terms of the maximum tolerable resistance distribution. Furthermore, the gain increases with increase in quantization levels until it saturates. In particular, with n=2, the LDPC-coded STT-MRAM channel achieves an increase of the tolerable resistance distribution of 2.3% (normalized by μ) at BER= $10^{-5}$. With n=3, the corresponding gain increases to 3%. In other word, with similar amount of redundant cells, the LDPC-coded channel with n=3 quantization bits in accordance with various embodiments gains 3% over the conventional BCH-ECC in terms of the maximum tolerable resistance distribution. Furthermore, the capacity maximizing uniform quantizer with n=3 achieves an error rate performance close to the unquantized case. It is also observed that the capacity maximization based design of quantizer gives significantly better performance than that with the MMSE criterion.

Figure 13:
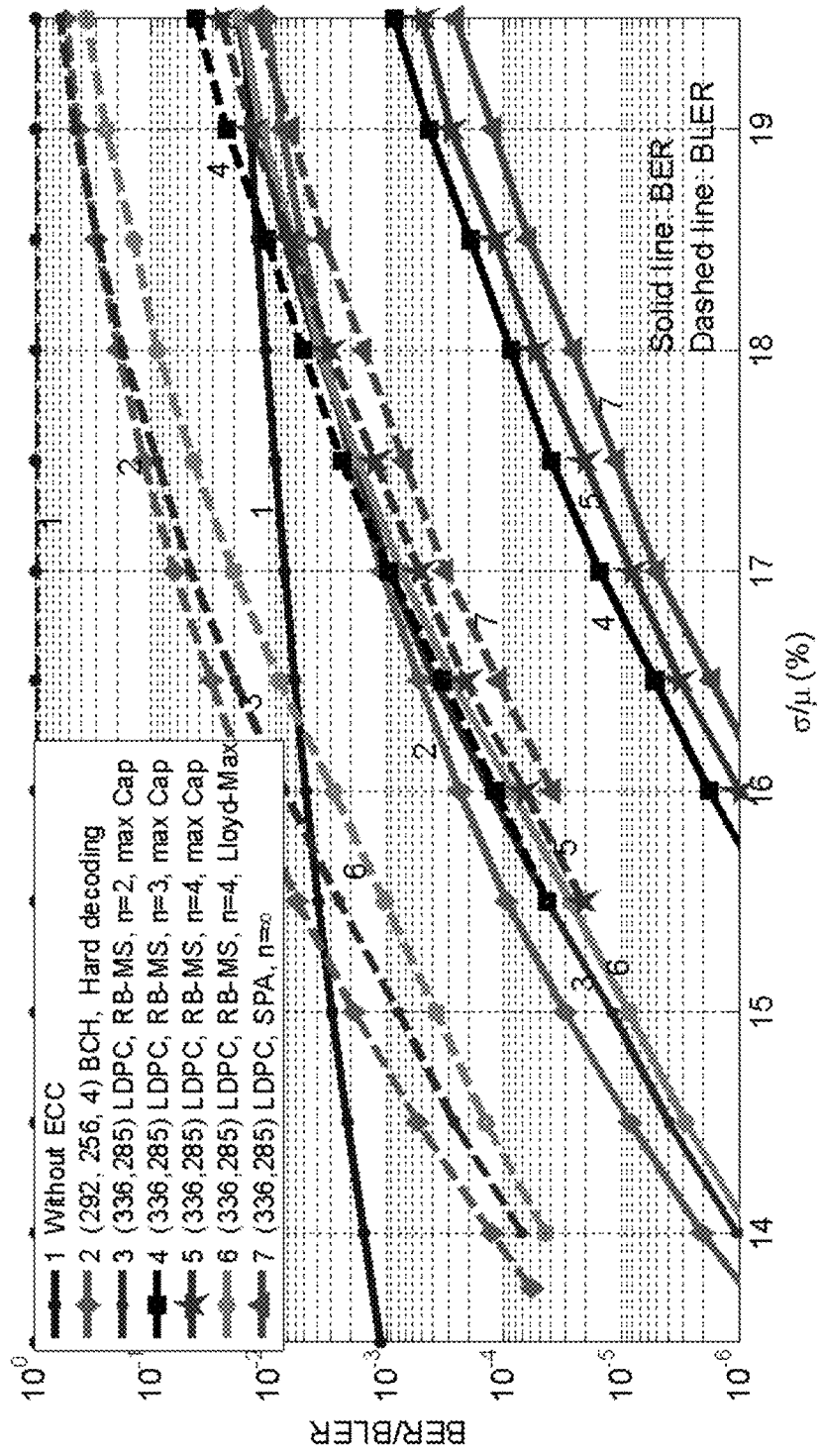
FIG. 13 shows the BER/BLER performance of STT-MRAM channels with short-block-length LDPC codes and a reduced complexity LDPC decoder, according to various embodiments.

In FIG. 13, the system's performance with the LDPC code with shorter codeword length, and with a reduced complexity LDPC decoder is further illustrated. In particular, a (336, 285) Euclidean Geometry (EG) LDPC code with rate 0.848 and minimum distance at least 5 is constructed. For the decoding of LDPC codes, the reliability-based min-sum (RB-MS) algorithm is used, which takes as input the integer index of the quantization interval that the received signal belongs to (i.e. the value j for each $y_k \in N_j$ in this case). Unlike the SPA, the RB-MS algorithm requires only integer/logical operations and hence has a much lower computational complexity. For comparison, a (292, 256) BCH code with t=4 is used in the simulations, as it has a similar code rate with the EG-LDPC code. From FIG. 13, it is observed that significant performance gain is obtained with a 3-bit capacity-maximizing quantizer, and the BER is close to that of the SPA decoder with full channel soft information (i.e., the unquantized resistances). There is only little performance improvement by increasing the number of quantization bits to 4 bits. With the short-block-length LDPC code, the 3-bit quantizer, and the RB-MS decoder, around two orders of magnitude reduction in BER over the BCH code has been achieved, and the performance gain sustains for a wide range of resistance spread. At the BER level of $10^{-6}$, performance improvement of 2% over the BCH code in terms of the maximum tolerable resistance spread is obtained. Similar performance gain is obtained for the BLER as well.

It should be appreciated that other than LDPC codes, the channel architecture in accordance with various embodiments, the quantizer as well as the soft-output detector may be used by other ECC coding schemes (e.g., RS, BCH codes, or turbo codes) with soft-decision decoding for STT-MRAM as well.

The LDPC-coded channel for STT-MRAM in accordance with various embodiments may provide better error rate performance than the conventional ECC-coded channel with hard decoding. The capacity maximization based design of quantizer in accordance with various embodiments is optimum in the sense that it maximizes the number of information bits that can be stored in a memory cell, enables the calculation of soft information for arbitrary resistance distributions, minimizes the number of quantization bits required, provides significantly better performance than the MMSE criterion, is faster than the conventional design based on computer simulations (i.e., to achieve the design within a shorter period of time as compared to using computer simulations), and is useful to design quantizer for low error rate regions.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A memory device comprising:
a memory cell configured to store an input data bit;
a memory sensor configured to read out a parameter associated with a state of the memory cell;
a detector configured to determine, based on the parameter read out from the memory cell, a soft information indicating the likelihood that the input data bit stored in the memory cell is a "0" or the likelihood that the input data bit stored in the memory cell is a "1"; and
a decoder configured to generate a decoded bit based on the soft information.

2. The memory device of claim 1, wherein the memory device comprises a non-volatile memory device.

3. The memory device of claim 1, wherein the memory device is a spin transfer torque magnetoresistive random access memory (STT-MRAM) device.

4. The memory device of claim 1, wherein the state comprises a high resistance state or a low resistance state.

5. The memory device of claim 4, wherein for the high resistance state, the memory cell has a resistance of any value following a resistance distribution of the high resistance state; and for the low resistance state, the memory cell has a resistance of any value following another resistance distribution of the low resistance state.

6. The memory device of claim 5, wherein each of the resistance distributions is a statistical distribution of resistance values.

7. The memory device of claim 6, wherein each of the resistance distributions is a Gaussian distribution of resistance values.

8. The memory device of claim 5, wherein at the high resistance state, the memory cell has a resistance value with mean of $\mu_H$=4.125 kOhm, and standard derivation of $\sigma_H$=0.1238 kOhm.

9. The memory device of claim 5, wherein at the low resistance state, the memory cell has a resistance value with mean of $\mu$=2.0625 kOhm and standard derivation of $\sigma$=0.0825 kOhm.

10. The memory device of claim 5, further comprising a quantizer configured to convert the resistance value of the memory cell into a quantized data.

11. The memory device of claim 10, wherein the quantizer comprises a n-bit quantizer.

12. The memory device of claim 10, wherein the detector is configured to determine the soft information based on a log-likelihood ratio (LLR) for the quantized data.

13. The memory device of claim 1, comprising an array of memory cells configured to store input data bits.

14. The memory device of claim 13, further comprising an encoder configured to encode the input data bits to be stored in the array of memory cells.

15. The non-volatile memory device of claim 14, wherein the encoder comprises a low-density parity-check (LDPC) encoder and wherein the decoder comprises a low-density parity-check (LDPC) decoder.

16. A method of performing soft-decision decoding on a data bit stored in a memory cell of a memory device, the method comprising:
reading out a state of a memory cell;
determining based on the state of the memory cell a soft information indicating the likelihood that a data bit stored in the memory cell is "0" or the likelihood that the data bit stored in the memory cell is "1"; and
generating a decoded bit based on the soft information.

17. The method of claim 16, further comprising converting a resistance value of the memory cell into a quantized data.

18. The method of claim 17, wherein converting the resistance value into the quantized data further comprises converting the resistance value into a quantized n-bit data.

19. The method of claim 17, wherein determining the soft information comprises determining the soft information based on a log-likelihood ratio (LLR) for the quantized data.

* * * * *